(12) United States Patent
Eskridge

(10) Patent No.: US 8,742,557 B2
(45) Date of Patent: Jun. 3, 2014

(54) DIE MOUNTING STRESS ISOLATOR

(75) Inventor: Mark H. Eskridge, Renton, WA (US)

(73) Assignee: Honeywell International Inc., Morristown, NJ (US)

( * ) Notice: Subject to any disclaimer, the term of this patent is extended or adjusted under 35 U.S.C. 154(b) by 1632 days.

(21) Appl. No.: 11/765,322

(22) Filed: Jun. 19, 2007

(65) Prior Publication Data

US 2008/0315397 A1 Dec. 25, 2008

(51) Int. Cl.
*H01L 23/02* (2006.01)
(52) U.S. Cl.
USPC ........................................................ 257/678
(58) Field of Classification Search
USPC ............ 257/178, 669, 693, E23.004, E23.01, 257/E23.023, E23.04, E23.08, E23.141; 438/132
See application file for complete search history.

(56) References Cited

U.S. PATENT DOCUMENTS

| | | | |
|---|---|---|---|
| 6,573,609 B2 | 6/2003 | Fjelstad et al. | |
| 6,674,159 B1 * | 1/2004 | Peterson et al. | 257/680 |
| 6,828,663 B2 * | 12/2004 | Chen et al. | 257/678 |
| 7,034,401 B2 | 4/2006 | Savastiouk et al. | |
| 2001/0026957 A1 * | 10/2001 | Atwood et al. | 438/122 |
| 2004/0046248 A1 | 3/2004 | Waelti et al. | |
| 2005/0205951 A1 * | 9/2005 | Eskridge | 257/416 |
| 2006/0097331 A1 | 5/2006 | Hattori et al. | |
| 2006/0128058 A1 * | 6/2006 | Dungan et al. | 438/106 |
| 2007/0117275 A1 | 5/2007 | DCamp et al. | |
| 2008/0029852 A1 | 2/2008 | Murayama et al. | |
| 2008/0156095 A1 | 7/2008 | Tsuji et al. | |

* cited by examiner

*Primary Examiner* — Jae Lee
(74) *Attorney, Agent, or Firm* — Shumaker & Sieffert, P.A.

(57) ABSTRACT

One method of the present invention includes preparing a die with traces and pads as desired for the intended use of the die. A MEMS device is mounted to the die. The die is then mounted to a substrate of the same material as the die. The substrate is then mounted to a package. The die and/or the substrate may be flip-chip mounted.

18 Claims, 3 Drawing Sheets

DIE MOUNTING STRESS ISOLATOR

GOVERNMENT INTEREST

The invention described herein was made in the performance of work Under U.S. Government Contract No. DAAE30-01-9-0100. The Government Agency is U.S. Army, TACOM-ARDEC. The Government may have rights to portions of this invention.

BACKGROUND OF THE INVENTION

Microelectromechanical systems (MEMS) devices or computer chips are often mounted on dies. Stresses due to die mounting can affect the performance of MEMS devices. The stresses change with temperature because of the differing coefficients of thermal expansion (CTE) of the package and the die; dies made of silicon or borosilicate glass typically have a lower CTE than that of the package, so as temperature changes, the package stresses the die. Thus, as shown in FIGS. 1A and 1B, a die 10 with a lower CTE than a package 12 are heated when attaching the die 10 to the package 12. When the assembly 14 cools, the package experiences more shrinkage than the die, and creates stress at attachment points 16. The stress affects the performance of the MEMS device 9.

The stresses also change due to shock when wire bonds change shape, which causes problems for capacitive sensors that require stable geometry for stable output. Additionally, making wire bonds at the package level makes the parts more expensive because each part must be handled separately, as well as increasing the chance of damage to the assembly.

SUMMARY OF THE INVENTION

The present invention provides a system and method of reducing the stress associated with a die mount, as well as eliminating the wire bonding operation.

In an example embodiment, a die is prepared with traces and pads as desired for the intended use of the die. A MEMS device is mounted to the die. The die is then mounted to a substrate of the same material as the die. The substrate is then mounted to a package.

BRIEF DESCRIPTIONS OF THE DRAWINGS

Preferred and alternative embodiments of the present invention are described in detail below with reference to the following drawings.

DETAILED DESCRIPTION OF THE PREFERRED EMBODIMENT

Figure 1A:
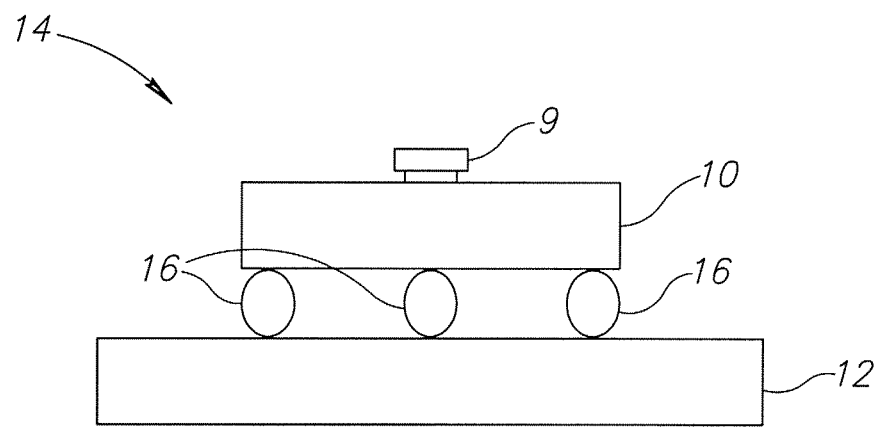
FIG. 1A is a cross-section of a package-mounted die according to the prior art at a temperature sufficient to attach the die to the package.
Figure 1B:
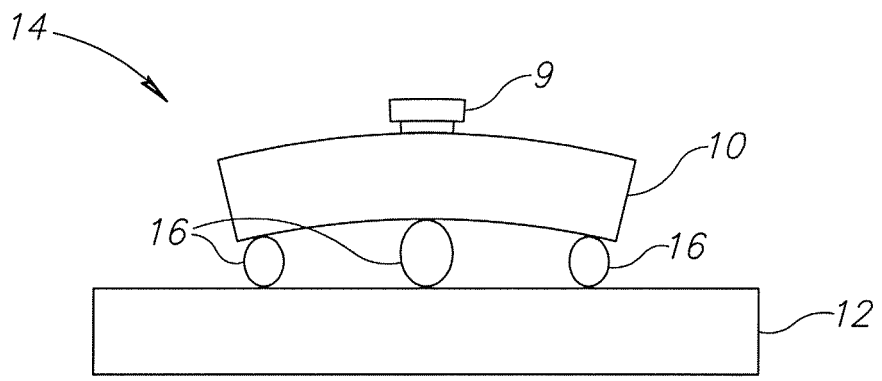
FIG. 1B is a cross-section of the package-mounted die of FIG. 1A after it has cooled.
Figure 2A:
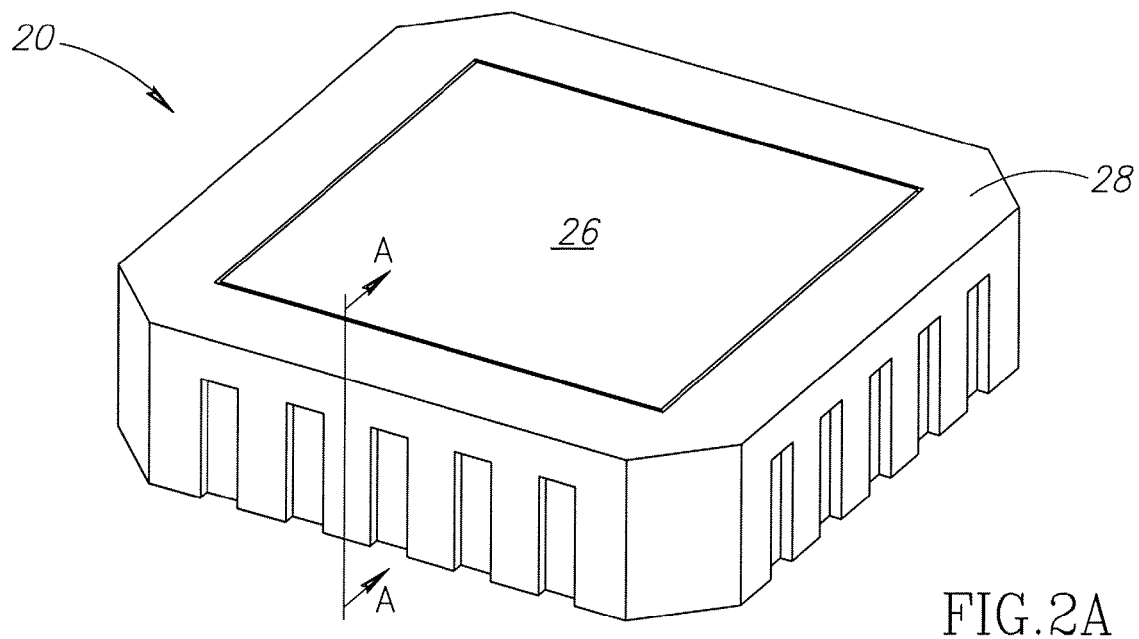
FIG. 2A is a perspective view of a package-mounted die according to the present invention.
Figure 2B:
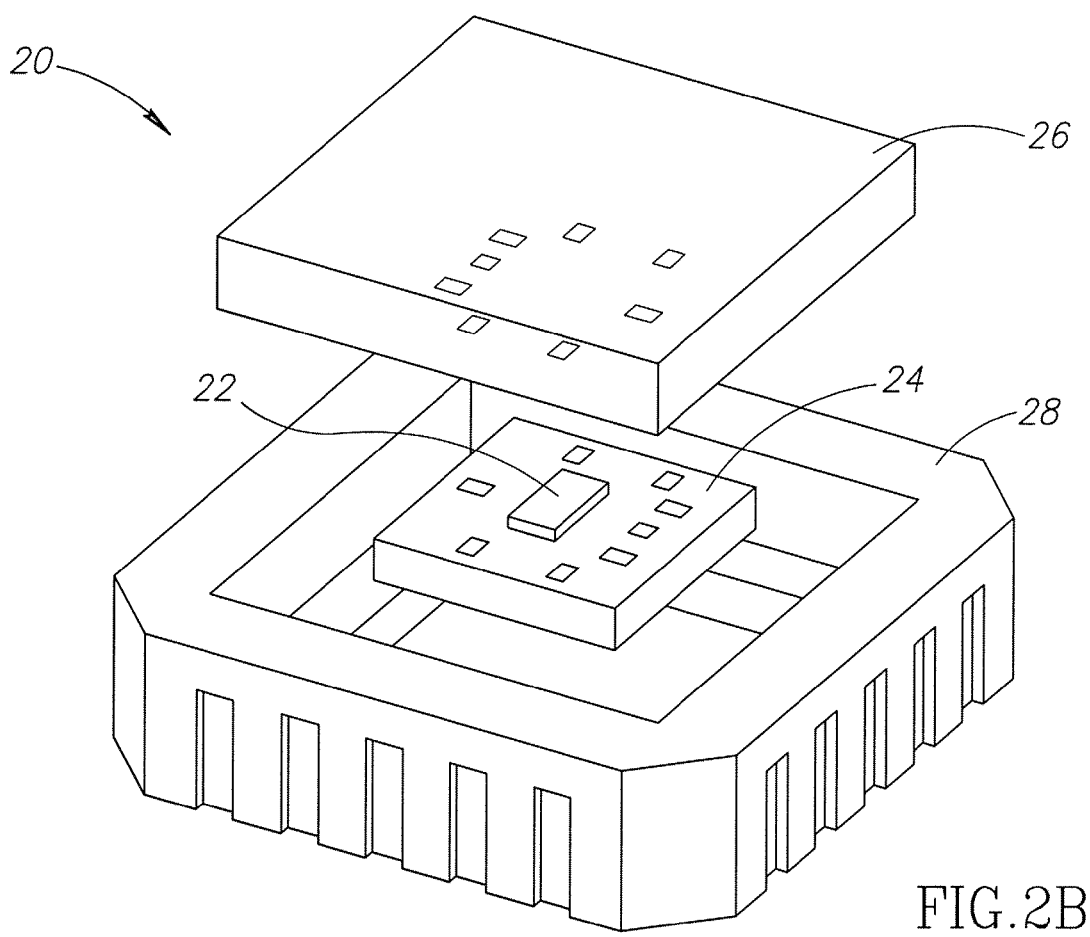
FIG. 2B is an exploded perspective view of the package-mounted die of FIG. 2A.
Figure 2C:
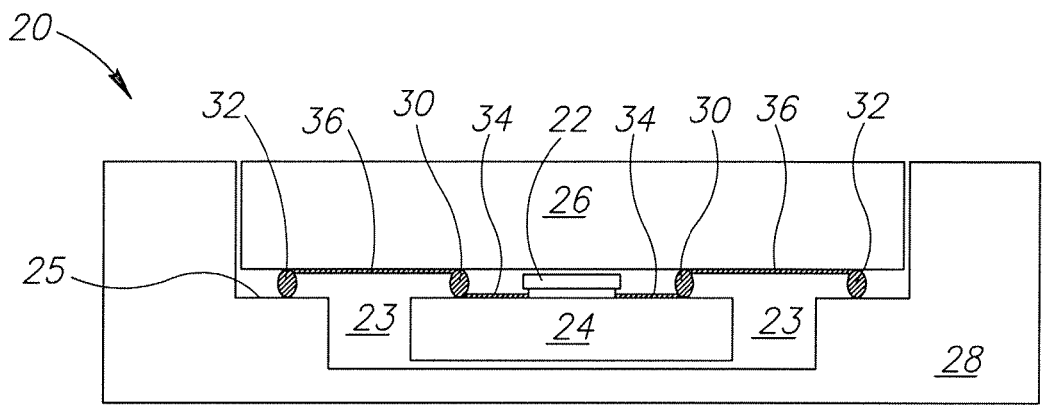
FIG. 2C is a cross-sectional view of the package-mounted die of FIG. 2A through the plane AA'.

With reference to FIGS. 2A-2C, a device 20 according to an embodiment of the present invention is shown. A MEMS device 22, which may be an accelerometer, a gyroscope, or any other suitable MEMS device, is mounted to a rectangular block die 24 during the MEMS build. The die 24 is mounted to a rectangular block cover plate 26 via gold bumps 30 (which can be approximately 0.001" to 0.005" in diameter, and the die 24 can be flip-chip mounted to the cover plate 26. The gold bumps 30 provide all of the structural strength necessary to prevent dislodging the die 24 during use. The MEMS device 22 can be protected from contact during flip-chip mounting using etched features or process controls. The cover plate 26 is mounted to a package 28, a rectangular block including a recess 23 (or wirebond shelf) with a step 25, sized and shaped to receive the MEMS device 22, the die 24, and the cover plate 26. The cover plate 26 is mounted to the step 25 of the package 28 via gold bumps 32, and the cover plate 26 can be flip-chip mounted to the package 28. The package 28 can be a Leadless Ceramic Chip Carrier (LCCC). Electrically conductive traces 34 from the MEMS device 22 to the gold bumps 30, and conductive traces 36 from the gold bumps 30 to the gold bumps 32 provide a connection between the MEMS device 22 and the package 28 so that the MEMS device 22 can be in electrical contact with devices or systems (not shown) outside the package as necessary depending on the intended use of the device 22.

The die 24 has a preselected CTE, and the package 28 has a preselected CTE that is higher than the CTE of the die 24. The cover plate 26 is preferably made of the same material as the die 24 with the same CTE as the die 24. Alternatively, the cover plate 26 is made of a different material than the die 24, as long as the CTE of the cover plate 26 has an intermediate CTE higher than the CTE of the die 24 and lower than the CTE of the package 28, and preferably the CTE of the cover plate 26 is closer to the CTE of the die 24 than the package 28.

Figure 3:
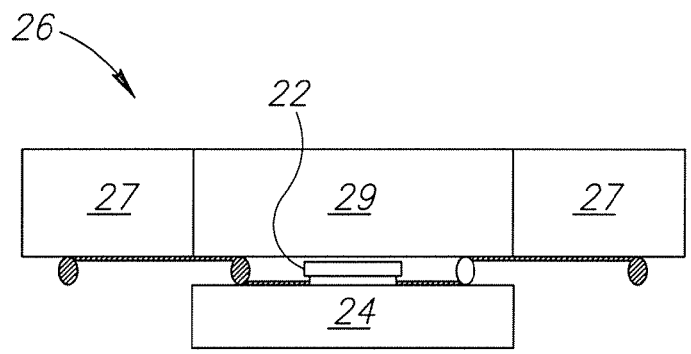
FIG. 3 is an alternate embodiment of a cover plate according to the present invention.

FIG. 3 shows a portion of an alternate embodiment of the present invention. The cover plate 26 includes a composite of first and second materials 27,29. The die 24 has a first CTE. The second material 29 has a CTE greater than the CTE of the die 24 and less than the CTE of the first material 27. The first material 27 has a CTE less than the CTE of the package 28. The package 28 is attached to the first material 27, and the die 24 is attached to the second material 29.

Figure 4:
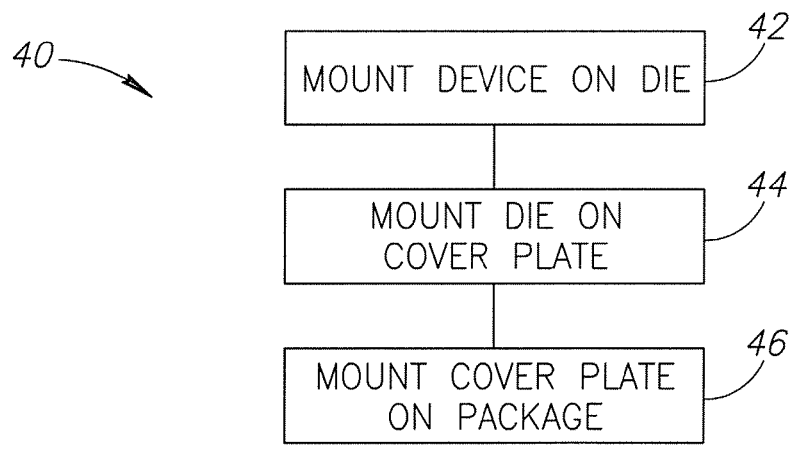
FIG. 4 is a flow diagram of a method according to the present invention.

FIG. 4 shows a process flow diagram of a method 40 for creating an embodiment of the present invention. At a block 42, a MEMS device is mounted to a die having a CTE equal or greater than the CTE of the MEMS device. At a block 44, the die is mounted to a cover plate having a CTE greater than the CTE of the die and less than the CTE of a package. Finally, at a block 46, the die is mounted to the package.

Note that the electrically conductive traces 34, 36 electrically connect the MEMS device to the package. The traces are mechanically more stable under shock than wirebonds, because they are printed on the package and cover plate.

While the preferred embodiment of the invention has been illustrated and described, as noted above, many changes can be made without departing from the spirit and scope of the invention. For example, the embodiments disclosed use gold bumps, but solder balls, conductive polymers, or directional conductors may be used instead. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A device comprising:
   a microelectromechanical systems (MEMS) device;

a die configured to support the MEMS device, the die having a first side and a first coefficient of thermal expansion;

a cover plate attached to the die, the cover plate having a first side and a second coefficient of thermal expansion;

a package attached to the cover plate, the package having a third coefficient of thermal expansion, wherein the third coefficient of thermal expansion is higher than the second coefficient of thermal expansion;

at least one first electrically conductive attachment device configured to attach the first side of the die to the first side of the cover plate; and at least one second electrically conductive attachment device configured to attach the first side of the cover plate to the package, wherein the at least one second electrically conductive attachment device is electrically coupled to the at least one first electrically conductive attachment device by a conductive trace disposed on the first side of the cover plate.

2. The device of claim 1, wherein the second coefficient of thermal expansion is the same as the first coefficient of thermal expansion.

3. The device of claim 1, wherein the first attachment device and the second attachment device each includes at least one of gold bumps, solder balls, conductive polymers, or directional conductors.

4. The device of claim 1 wherein the die is configured to support the MEMS device on the first side of the die, and the first side of the die is attached to the first side of the MEMS device.

5. The device of claim 1, the package further including a recess sized and shaped to receive the MEMS device, the die, and the cover plate, the recess including a step.

6. The device of claim 5, wherein the first side of the cover plate is attached to the step of the package.

7. The device of claim 1, wherein the package is one of a Leadless Ceramic Chip Carrier, a Leaded Ceramic Carrier, a Leaded Plastic Chip Carrier, and a Leadless Plastic Chip Carrier.

8. The device of claim 1, wherein the cover plate further includes:

a first cover plate material having a fourth coefficient of thermal expansion; and a second cover plate material having a fifth coefficient of thermal expansion different from the fourth coefficient of thermal expansion, wherein the second cover plate material is different from the first cover plate material;

wherein the fourth coefficient of thermal expansion is lower than the fifth coefficient of thermal expansion, wherein the die is attached to the first cover plate material, and wherein the package is attached to the second cover plate material.

9. The device of claim 1, wherein the at least one first attachment device is not wire bonds.

10. The device of claim 1, wherein the second coefficient of thermal expansion is larger than the first coefficient of thermal expansion.

11. The device of claim 1, wherein the first electrically conductive attachment device is operable to provide all of the structural strength necessary to prevent dislodging of the die during use.

12. The device of claim 11, wherein the die is structurally coupled only to the cover plate.

13. The device of claim 11, wherein the die is structurally uncoupled from the package.

14. The device of claim 1, further comprising:

the conductive trace, wherein the at least one first electrically conductive attachment device is separated from the at least one second electrically conductive attachment device by the conductive trace.

15. The device of claim 1, further comprising:

at least one die conductive trace disposed on a surface of the first side of the die, wherein the at least one first electrically conductive attachment device is electrically coupled to the MEMS device by the at least one die conductive trace.

16. The device of claim 8, wherein the fourth coefficient of thermal expansion is substantially the same as the first coefficient of thermal expansion of the die.

17. The device of claim 8, wherein the fifth coefficient of thermal expansion is substantially the same as the third coefficient of thermal expansion of the package.

18. The device of claim 8, wherein the fourth coefficient of thermal expansion is substantially the same as the first coefficient of thermal expansion of the die, and wherein the fifth coefficient of thermal expansion is substantially the same as the third coefficient of thermal expansion of the package.

* * * * *